(12) United States Patent
Shidore et al.

(10) Patent No.: US 11,929,475 B2
(45) Date of Patent: Mar. 12, 2024

(54) BATTERY HEATING DURING VEHICLE OPERATION AND/OR DURING VEHICLE CHARGING

(71) Applicant: GM GLOBAL TECHNOLOGY OPERATIONS LLC, Detroit, MI (US)

(72) Inventors: Neeraj S. Shidore, Novi, MI (US); Chandra S. Namuduri, Troy, MI (US); Lei Hao, Troy, MI (US); Shuonan Xu, Troy, MI (US); Suresh Gopalakrishnan, Troy, MI (US); Satish P. Ketkar, Troy, MI (US); Daniel Robert Tylutki, Livonia, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/847,740

(22) Filed: Jun. 23, 2022

(65) Prior Publication Data

US 2023/0420763 A1    Dec. 28, 2023

(51) Int. Cl.
*H01M 10/615* (2014.01)
*G01R 31/382* (2019.01)
*H01M 10/48* (2006.01)
*H01M 10/625* (2014.01)
*H01M 10/63* (2014.01)
(Continued)

(52) U.S. Cl.
CPC ........ *H01M 10/615* (2015.04); *G01R 31/382* (2019.01); *H01M 10/48* (2013.01); *H01M 10/625* (2015.04); *H01M 10/63* (2015.04); *H01M 10/6571* (2015.04); *H02J 7/0068* (2013.01); *H02M 1/0009* (2021.05); *H02M 3/158* (2013.01); *H02M 7/53871* (2013.01); *H01M 2220/20* (2013.01)

(58) Field of Classification Search
CPC .................................................. H01M 2220/20
See application file for complete search history.

(56) References Cited

U.S. PATENT DOCUMENTS 5,686,839 A * 11/1997 Takagi ..................... B60L 7/003
                                                                  324/510
6,882,061 B1 * 4/2005 Ashtiani ............. H02J 7/00712
                                                                  219/209

(Continued)

OTHER PUBLICATIONS

German Office Action for DE Application No. 102022128215.5 (translation not available) dated Jul. 31, 2023, 5 pp.

*Primary Examiner* — Daniel Kessie
(74) *Attorney, Agent, or Firm* — CANTOR COLBURN LLP

(57) ABSTRACT

A device for thermal control of a battery system includes a heating control module electrically connected to the battery system and a conversion device configured to control power output from the battery system. The heating control module is configured to measure a current through the conversion device, the measured current provided by the battery system of a vehicle during vehicle operation or provided by an energy source during vehicle charging. The heating control module is also configured to control the conversion device to generate an alternating current (AC) heating current using the measured current, and apply the AC heating current to the battery system to heat the battery system to a desired temperature.

20 Claims, 11 Drawing Sheets

(51) Int. Cl.
*H01M 10/6571* (2014.01)
*H02J 7/00* (2006.01)
*H02M 1/00* (2006.01)
*H02M 3/158* (2006.01)
*H02M 7/5387* (2007.01)

(56) References Cited

U.S. PATENT DOCUMENTS

| | | | |
|---|---|---|---|
| 2013/0069570 A1* | 3/2013 | Chen | B60L 50/16 |
| | | | 318/400.09 |
| 2014/0087215 A1* | 3/2014 | Kim | H01M 10/637 |
| | | | 429/50 |
| 2018/0145676 A1* | 5/2018 | Tran | H03K 19/017509 |
| 2020/0144684 A1* | 5/2020 | Takamatsu | H01M 10/637 |
| 2020/0395883 A1* | 12/2020 | Iwamoto | H02P 29/60 |
| 2021/0061128 A1* | 3/2021 | Lee | B60L 58/27 |
| 2022/0200504 A1 | 6/2022 | Lee et al. | |
| 2022/0216714 A1* | 7/2022 | Zhang | B60L 50/51 |
| 2023/0062270 A1 | 3/2023 | Li et al. | |
| 2023/0249520 A1* | 8/2023 | Turudic | B60L 50/51 |
| | | | 165/201 |

\* cited by examiner

BATTERY HEATING DURING VEHICLE OPERATION AND/OR DURING VEHICLE CHARGING

INTRODUCTION

The subject disclosure relates to thermal control of batteries, and more specifically, to heating a battery assembly or system using an applied electrical current.

Vehicles, including gasoline and diesel power vehicles, as well as electric and hybrid electric vehicles, feature battery storage for purposes such as powering electric motors, electronics and other vehicle subsystems. In low temperature environments, maintaining proper operating temperatures can be a challenge. For example, charging of batteries can become limited in low temperature situations. Accordingly, it is desirable to provide a device or system that can provide battery capabilities in various low temperature conditions.

SUMMARY

In one exemplary embodiment, a device for thermal control of a battery system includes a heating control module electrically connected to the battery system and a conversion device configured to control power output from the battery system. The heating control module is configured to measure a current through the conversion device, the measured current provided by the battery system of a vehicle during vehicle operation or provided by an energy source during vehicle charging. The heating control module is also configured to control the conversion device to generate an alternating current (AC) heating current using the measured current, and apply the AC heating current to the battery system to heat the battery system to a desired temperature.

In addition to one or more of the features described herein, the vehicle includes a first electric motor connected to a first inverter, and a second electric motor connected to a second inverter.

In addition to one or more of the features described herein, controlling the conversion device includes controlling a phase leg of the first inverter to generate the AC heating current.

In addition to one or more of the features described herein, the phase leg includes a quasi-resonant circuit (QRC) having an inductor, a capacitor and a half bridge switch configuration, and controlling the phase leg includes controlling the QRC to generate the AC heating current.

In addition to one or more of the features described herein, the first electric motor and the battery system provide the measured current during vehicle operation and when an electric motor is idle.

In addition to one or more of the features described herein, the measured current is provided by the energy source during the charging.

In addition to one or more of the features described herein, controlling the conversion device includes electrically connecting the energy source to a phase leg of the first inverter or a phase leg of the second inverter.

In addition to one or more of the features described herein, the conversion device is a DC-DC converter, and controlling the conversion device includes controlling the DC-DC converter to generate the AC heating current when the first electric motor is idle.

In addition to one or more of the features described herein, the conversion device is a DC-DC converter, and controlling the conversion device includes controlling the DC-DC converter to generate the AC heating current using energy supplied by the energy source and the battery system when the vehicle is charging.

In another exemplary embodiment, a method of thermally controlling a battery system of a vehicle includes measuring a current through a conversion device configured to control power output from the battery system, the measured current provided by the battery system of the vehicle during vehicle operation or provided by an energy source during vehicle charging. The method also includes controlling, by a heating control module, the conversion device to generate an alternating current (AC) heating current using the measured current, and applying the AC heating current to the battery system to heat the battery system to a desired temperature.

In addition to one or more of the features described herein, the vehicle includes a first electric motor connected to a first inverter and a second electric motor connected to a second inverter, and wherein controlling the conversion device includes controlling a phase leg of the first inverter to generate the AC heating current.

In addition to one or more of the features described herein, the phase leg includes a quasi-resonant circuit (QRC) having an inductor, a capacitor and a half bridge switch configuration, and controlling the phase leg includes controlling the QRC to generate the AC heating current.

In addition to one or more of the features described herein, the first electric motor and the battery system provide the measured current when an electric motor is idle.

In addition to one or more of the features described herein, the measured current is provided by the energy source during the charging.

In addition to one or more of the features described herein, the conversion device is a DC-DC converter, and controlling the conversion device includes controlling the DC-DC converter to generate the AC heating current when the first electric motor is idle.

In addition to one or more of the features described herein, the conversion device is a DC-DC converter, and controlling the conversion device includes controlling the DC-DC converter to generate the AC heating current using energy supplied by the energy source and the battery system when the vehicle is charging.

In yet another exemplary embodiment, a vehicle system includes a memory having computer readable instructions, and a processing device for executing the computer readable instructions, the computer readable instructions controlling the processing device to perform a method. The method includes measuring a current through a conversion device configured to control power output from a battery system, the measured current provided by the battery system of a vehicle during vehicle operation or provided by an energy source during vehicle charging. The method also includes controlling the conversion device to generate an alternating current (AC) heating current using the measured current, and applying the AC heating current to the battery system to heat the battery system to a desired temperature.

In addition to one or more of the features described herein, the vehicle includes a first electric motor connected to a first inverter and a second electric motor connected to a second inverter, and wherein controlling the conversion device includes controlling a phase leg of the first inverter to generate the AC heating current.

In addition to one or more of the features described herein, the conversion device is a DC-DC converter, and controlling the conversion device includes controlling the DC-DC converter to generate the AC heating current when an electric motor is idle.

In addition to one or more of the features described herein, the conversion device is a DC-DC converter, and controlling the conversion device includes controlling the DC-DC converter to generate the AC heating current using energy supplied by the energy source and the battery system when the vehicle is charging.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
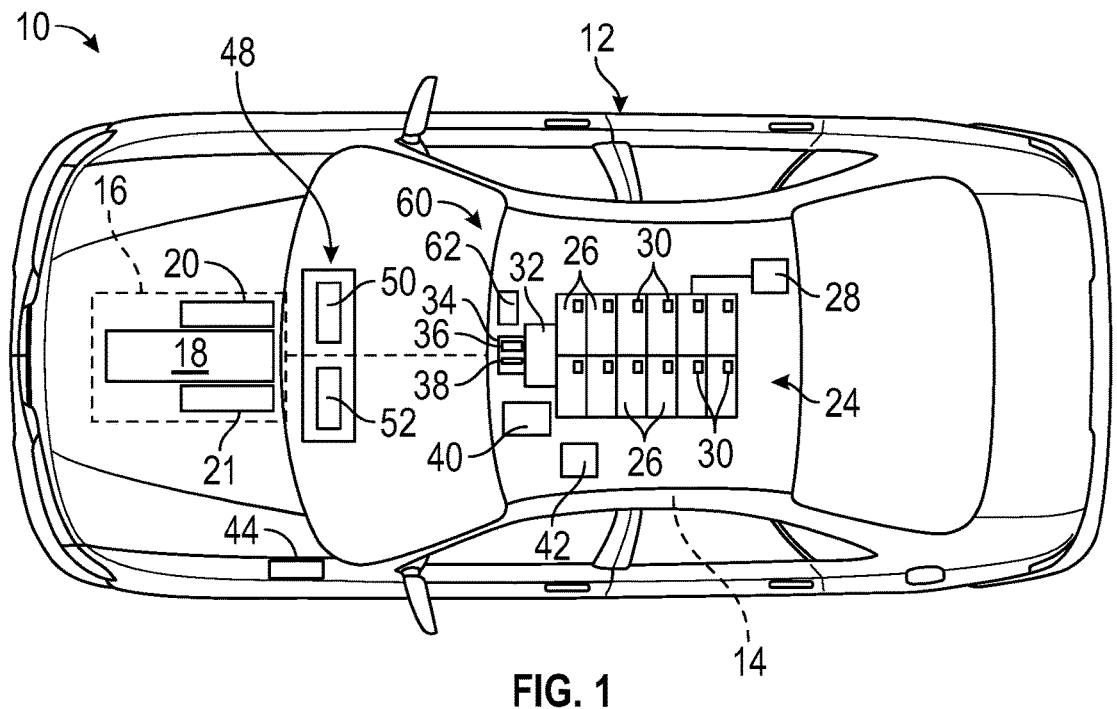
FIG. 1 is a top view of a motor vehicle including a battery assembly or system and a battery thermal management system, in accordance with an exemplary embodiment.

The following description is merely exemplary in nature and is not intended to limit the present disclosure, its application or uses. It should be understood that throughout the drawings, corresponding reference numerals indicate like or corresponding parts and features.

In accordance with an exemplary embodiment, methods, devices and systems are provided for thermal control of battery assemblies and battery systems, such as vehicle battery assemblies or systems. An embodiment of a battery heating system is configured to heat or increase the temperature of a battery system (e.g. a battery pack) by applying an alternating current (AC current) to the battery system. The AC current is applied using an electric motor in the vehicle during vehicle operation (e.g., during vehicle motion or while the vehicle is stationary), and/or using an energy source such as a charging station during battery charging.

In an embodiment, the vehicle is a dual or multi-motor system that uses two or more electric motors for propulsion. The heating system uses energy provided by an idle motor (i.e., a motor that is not producing torque), by controlling an inverter connected to the idle motor or a DC-DC converter in the vehicle to modulate current from the idle motor to produce the AC heating current. In another embodiment, the heating system controls an inverter or a DC-DC converter to modulate current from a charging station to produce the AC heating current.

Embodiments described herein present numerous advantages and technical effects. The embodiments provide for uniform and controllable heating of a battery assembly or system using existing vehicle components. The embodiments provide for effective heating in low temperature environments (e.g., below 25 degrees C.). In such environments, heat generation is typically inefficient, resulting in negative range impact and performance degradation. In addition, DC fast charging (DCFC) power can be limited at low temperatures. The embodiments provide a solution to the above problems, while also avoiding the need for additional components or auxiliary heating devices (e.g., PTC heaters). In addition, the embodiments are more efficient than other heating devices.

The embodiments are not limited to use with any specific vehicle and may be applicable to various contexts. For example, embodiments may be used with automobiles, trucks, aircraft, construction equipment, farm equipment, automated factory equipment and/or any other device or system for which additional thermal control may be desired to facilitate a device or system's existing thermal control capabilities or features.

FIG. 1 shows an embodiment of a motor vehicle 10, which includes a vehicle body 12 defining, at least in part, an occupant compartment 14. The vehicle body 12 also supports various vehicle subsystems including a propulsion system 16, and other subsystems to support functions of the propulsion system 16 and other vehicle components, such as a braking subsystem, a suspension system, a steering subsystem, a fuel injection subsystem, an exhaust subsystem and others.

The vehicle 10 may be a combustion engine vehicle, an electrically powered vehicle (EV) or a hybrid vehicle. In an embodiment, the vehicle 10 is a hybrid vehicle that includes a combustion engine assembly 18 and at least one electric motor assembly. For example, the propulsion system 16 includes a first electric motor 20 and a second electric motor 21. The motors 20 and 21 may be configured to drive wheels on opposing sides of the vehicle 10. Any number of motors positioned at various locations may be used.

The vehicle 10 includes a battery system 22, which may be electrically connected to the motors 20 and 21 and/or other components, such as vehicle electronics. The battery system 22 may be configured as a rechargeable energy storage system (RESS).

In an embodiment, the battery system 22 includes a battery assembly such as a high voltage battery pack 24 having a plurality of battery modules 26. Each of the battery modules 26 includes a number of individual cells (not shown). The battery system 22 may also include a monitoring unit 28 configured to receive measurements from sensors 30. Each sensor 30 may be an assembly or system having one or more sensors for measuring various battery and environmental parameters, such as temperature, current and voltages. The monitoring unit 28 includes components such as a processor, memory, an interface, a bus and/or other suitable components.

The battery system 22 is electrically connected to a DC-DC converter module 32 and an inverter module 34. The inverter module 34 (e.g., a traction power inversion unit or TPIM) converts direct current (DC) power from the battery assembly to three-phase alternating current (AC) power to drive the motors. In an embodiment, the inverter module 34 includes a first inverter 36 connected to the motor 20, and a second inverter 38 connected to the motor 21.

The battery system 22 may also be connected to other vehicle components or systems. For example, the battery system 22 is connected to an auxiliary power module (APM) 40, which controls power output to components such as a heating system. The APM 40 can be used to supply power from the battery system 22 for heating the occupant compartment 14.

The vehicle 10 may include a charging system that can be used to charge the battery pack 24 and/or used for supplying power from the battery pack 24 to charge another energy storage system (e.g., vehicle-to-vehicle charging). The charging system includes an onboard charging module (OBCM) 42 that is electrically connected to a charge port 44.

The vehicle 10 also includes a computer system 48 that includes one or more processing devices 50 and a user interface 52. The various processing devices and units may communicate with one another via a communication device or system, such as a controller area network (CAN) or transmission control protocol (TCP) bus.

Components of the vehicle form all or part of a heating system 60 configured to generate an alternating current (AC) signal (also referred to as an "AC current," a "heating current" or an "AC heating current") and apply the AC current signal to the battery pack 24. The heating system 60 may be used to heat the battery pack 24 during vehicle motion, when the vehicle is operating and at a stand-still, and/or during charging of the vehicle.

In an embodiment, the heating system 60 is configured to use energy generated by the battery pack 24 and an electric motor and/or charging station (or other energy source) to apply an AC heating current to the battery pack 24 by controlling a conversion device (e.g., an inverter and/or DC-DC converter). The AC heating current may be generated by controlling components of the conversion device as a quasi-resonant circuit (QRC).

During motion of a vehicle having a multi-motor architecture (i.e., having a plurality of electric motors used for propulsion), one or more of the electric motors can have significant idle time. An electric motor is at idle when the motor is rotating but not generating any torque (or any significant amount of torque), or is declutched from a vehicle axle if such a clutch is available. In an embodiment, the heating system 60 is configured to use energy generated by the idling motor during driving (or stand-still) to generate an AC heating current by controlling a phase leg of a corresponding inverter (idle inverter) to generate the AC current. In another embodiment, the system 60 uses energy from a charging station or other energy source during charging by connecting an idle inverter to the charging system and generating an AC current in the idle inverter.

In an embodiment, the heating system 60 is configured to use energy from an idle electric motor, or from an energy source (during charging), and generate an AC heating current via a DC-DC converter. The DC-DC converter may be the DC-DC converter module 32 or other DC-DC converter in the vehicle 10. For example, during vehicle motion (or while the vehicle is idling), the DC-DC converter module 32 is electrically connected to an idle inverter and current is converted to an AC current signal by controlling the DC-DC converter module 32. In another example, during charging, the DC-DC converter module 32 is connected to the battery assembly 22 and the DC-DC module 32 converter is controlled to generate the AC heating current.

The heating system 60 includes a heating control module 62 configured to control aspects of heating, including controlling switches in an inverter (e.g., the inverter 36 or the inverter 38) or DC-DC converter (e.g., the DC-DC converter module 32) to connect and disconnect a conversion device, and controlling conversion circuitry (e.g., as a QRC) to generate the heating current. The control module 62 may be a dedicated controller installed in the vehicle 10, or may be an existing controller, such as the monitoring unit 28, the OCBM 42, the APM 40 or the computer system 48. The heating control module 62 (also referred to as a "controller") can also be realized using a combination of controllers.

Figure 2:
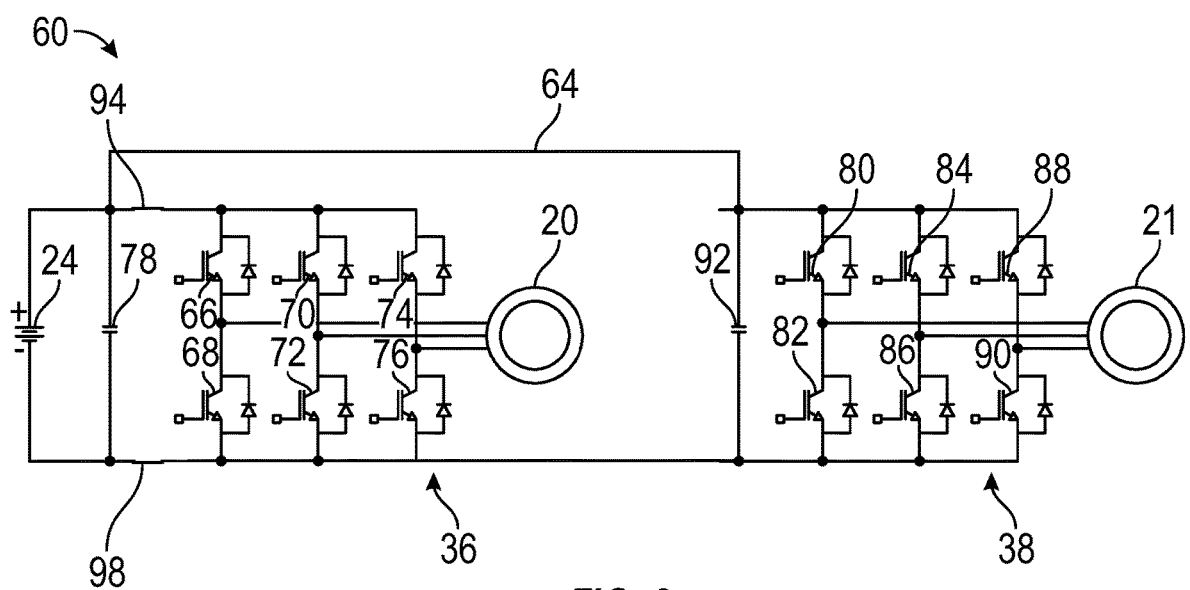
FIG. 2 depicts a portion of a dual motor propulsion system, including components used by a battery heating system, in accordance with an exemplary embodiment.

FIG. 2 depicts a dual motor propulsion system, including components of an embodiment of the heating system 60. The propulsion system includes the first inverter 36 coupled to the motor 20, and the second inverter 38 coupled to the motor 21. Components of the inverter 36 and/or the inverter 38 are employed as part of the heating system 60 and controlled by the controller 62. As discussed further herein, when the vehicle 10 is driving and the first motor 20 is idle, the first inverter 36 can be controlled to provide AC current heating, and the second motor 21 and the second inverter 38 can be simultaneously used for propulsion. Although the first inverter 36 is discussed as the heating inverter, the roles of the inverters can be reversed as needed.

In an embodiment, the first inverter 36 and the second inverter 38 are three-phase inverters connected to the battery pack 24 via a DC propulsion bus 64. The first inverter 36 includes three sets of switches connected in parallel to one another and connected to the battery pack 24 and the motor 20. Each set of switches is in a half-bridge configuration. A first set of switches 66 and 68 is connected to a first motor phase (phase A), a second set of switches 70 and 72 connected to a second motor phase (phase B), and a third set of switches 74 and 76 is connected to a third motor phase (phase C). A capacitor 78 is connected in parallel to the sets of switches for filtering out current ripple.

The second inverter 38 also includes three sets of switches in half-bridge configurations, which are connected to the motor 21. A first set of switches 80 and 82 is connected to a first motor phase (phase A), a second set of switches 84 and 86 is connected to a second motor phase (phase B), and a third set of switches 88 and 90 is connected to a third motor phase (phase C). A capacitor 92 is connected in parallel to the sets of switches.

Any suitable device may be employed as a switch. For example, the switches can include solid state relays and transistors such as Silicon (Si) insulated gate bipolar transistors (IGBTs), and field-effect transistors (FETs). Examples of FETs include metal-oxide-semiconductor FETs (MOSFETs), Si MOSFETs, silicon carbide (SiC) MOSFETs, gallium nitride (GaN) high electron mobility transistors (HEMTs), and SiC junction-gate FETs (JFETs). Other examples of switches that can be used include diamond, gallium oxide and other wide band gap (WBG) semiconductor-based power switch devices.

Figure 3:
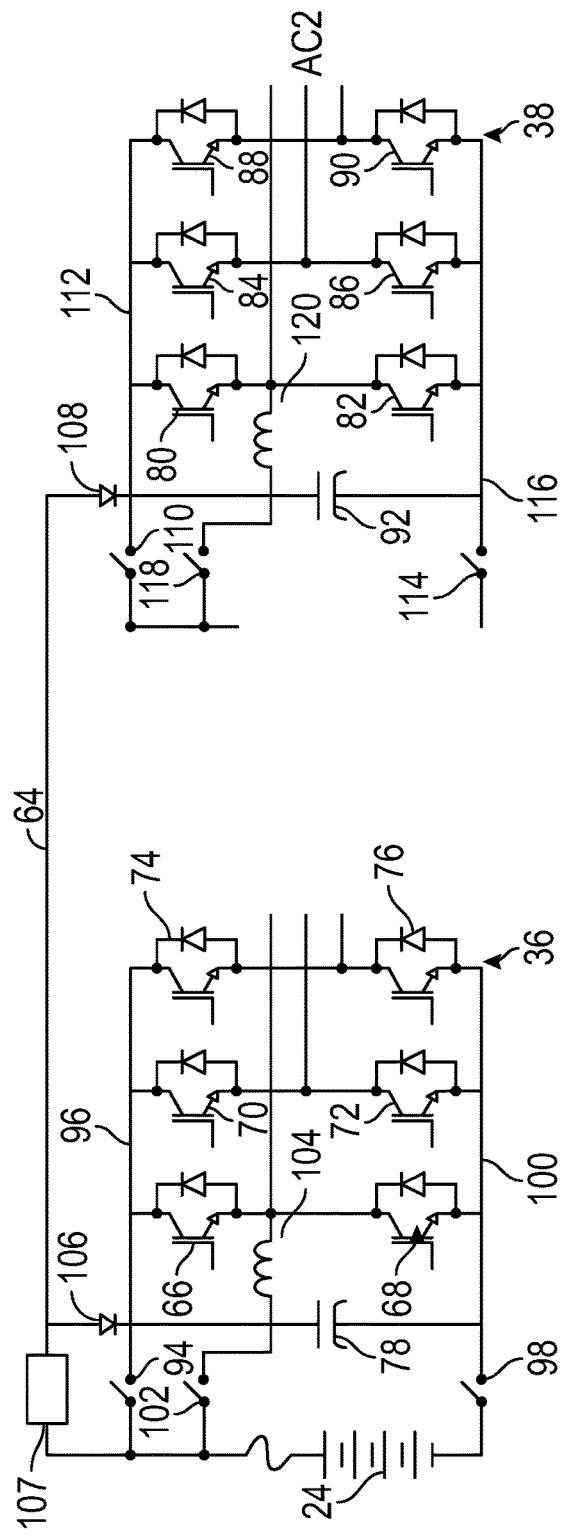
FIG. 3 depicts a first inverter and a second inverter configured for use as part of a battery heating system to apply a heating current to a battery assembly or system, in accordance with an exemplary embodiment.

FIG. 3 depicts an embodiment of the heating system 60, including components for facilitating battery heating during vehicle motion (or otherwise during vehicle operation) when a motor is idle. The first inverter 36 is connected to the battery pack 24 via a switch 94 (S11) connecting a positive terminal of the battery pack 24 to a positive bus 96 (DC1+), and a switch 98 (S21) connecting a negative terminal of the battery pack to a negative bus 100 (DC1-).

As discussed further herein, the first inverter 36 can be selectively disengaged from the DC propulsion bus 64 so that the first inverter 36 can be controlled to apply an AC heating current. Simultaneously, the second inverter 38 may remain engaged to the DC propulsion bus 64 to provide propulsion. Similarly, the second inverter 38 can be selectively disengaged for heating, and the first inverter 36 can be maintained in engagement to provide propulsion.

In order to selectively disengage the first inverter 36 from the DC propulsion bus 64, a switch 102 and an inductor 104 (L1) are connected between the positive terminal and a leg of the inverter 36. A diode 106 (D1) provides for isolation of the inverter 36, in combination with the inductor 104, when the switch 102 is closed (turned ON). The switch 102 and the inductor 104 may be connected to a phase A leg of the inverter 36 as shown, or to any other leg. A pre-charger 107 may be included to limit inrush current.

The second inverter 38 is connected to the propulsion bus 64 via a diode 108 (D2). The second inverter 38 includes a switch 110 (S21) connecting a positive terminal of the battery pack 24 to a positive bus 112 (DC2+), and a switch 114 (S22) connecting a negative terminal of the battery pack to a negative bus 116 (DC2-). The second inverter 38 also includes a switch 118 (Sw2) and an inductor 120 (L2) connected between the positive terminal and a leg of the inverter 38.

If the first motor 20 is idle (e.g., during vehicle motion), the first inverter 36 can be put into a heating mode in which the first inverter 36 is disengaged from the DC propulsion bus 64 and used for heating. Simultaneously, the second inverter 38 is put into (or maintained in) a propulsion mode in which the second inverter 38 is engaged to the DC propulsion bus 64 and used for propulsion. If the second motor 21 is idle, the second inverter 38 can be put into the heating mode while the first inverter 36 is in the propulsion mode.

When the first inverter 36 is in the heating mode, the switch 94 (S11) is open, and the switches 102 (Sw1) and 98 (S21) are closed. In the propulsion mode, the switches 94 (S11) and 98 (S21) are closed, and the switch 102 (Sw1) is open.

Likewise, when the second inverter 38 is in the heating mode, the switch 110 (S21) is open, and the switches 118 (Sw2) and 114 (S22) are closed. In the propulsion mode, the switches 110 (S21) and 114 (S22) are closed, and the switch 118 (Sw2) is open.

Figure 4:
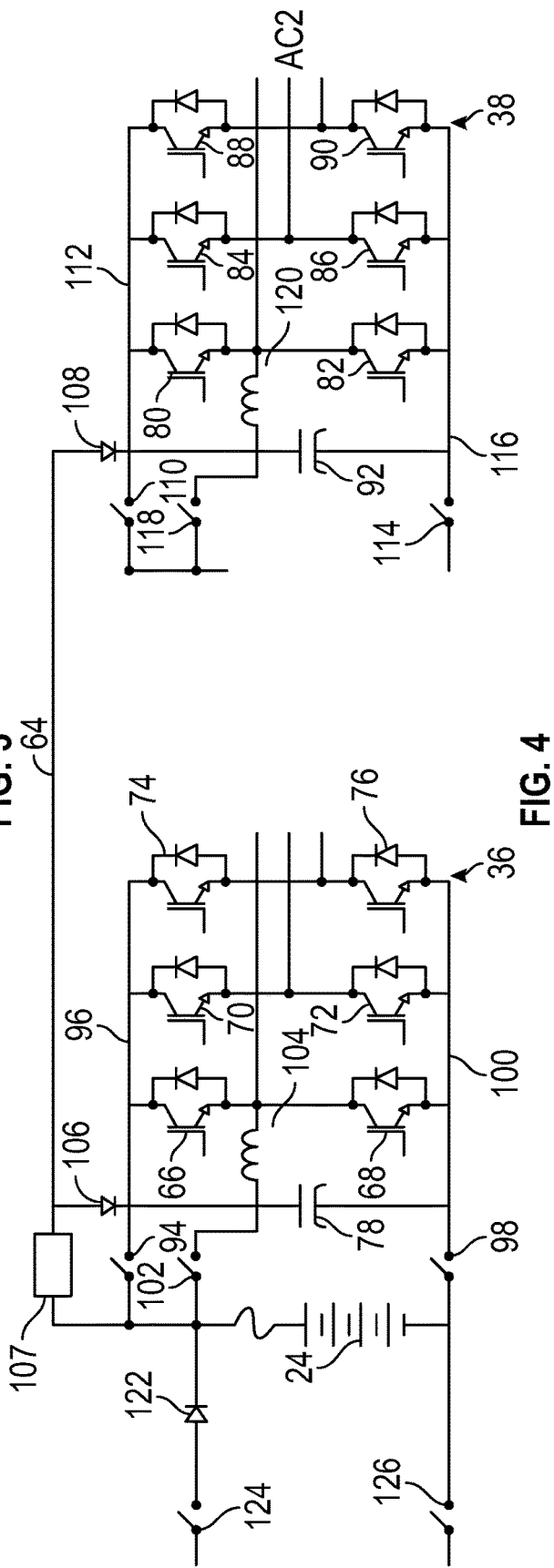
FIG. 4 depicts the first inverter and the second inverter configured for applying a heating current to a battery assembly or system during charging of the battery system, in accordance with an exemplary embodiment.

FIG. 4 depicts an embodiment of the heating system 60, including components for facilitating battery heating during charging. In an embodiment, the heating is performed during a DC fast charging (DCFC) or Level 3 charging process. DCFC chargers can range in output from 50 kW to 350 kW, and can recharge an EV battery assembly to 80% over a time period that typically ranges from about 15 minutes to about 45 minutes.

In this embodiment, the leg of the first inverter 36 is connected to an energy source, such as a DCFC charging station, through a diode 122 (D3), which prevents the AC heating current from flowing into the charging station while allowing the AC heating current to flow through the battery pack 24. A first charging switch 124 (Sc1) is connected to a positive terminal (DCFC+) of the charging station, and a second charging switch 126 (Sc2) is connected to a negative terminal (DCFC-) of the charging station. To put the first inverter 36 into the heating mode and apply a heating current, the switch 94 (S11) is open, and the switches 102 (Sw1) and 98 (S21) are closed.

When an inverter is in the heating mode, the leg of the inverter is used to generate the AC heating current by operating the leg as a quasi-resonant circuit (QRC). In the first inverter 36, the switch 102 (Sw1), the inductor 104 (L1) and the capacitor 78 (C1) form a QRC for generating the heating current. In the second inverter 38, the switch 118 (Sw2), the inductor 120 (L2) and the capacitor 92 (C2) form a QRC for generating the heating current.

For example, the controller 62 operates the switches 66 and 68 to generate a current having an AC waveform with a selected amplitude and frequency. The AC heating current is superimposed on existing current, which may be current through the other inverter 38 (if heating during driving) or charging current (if heating during charging).

Figure 5:
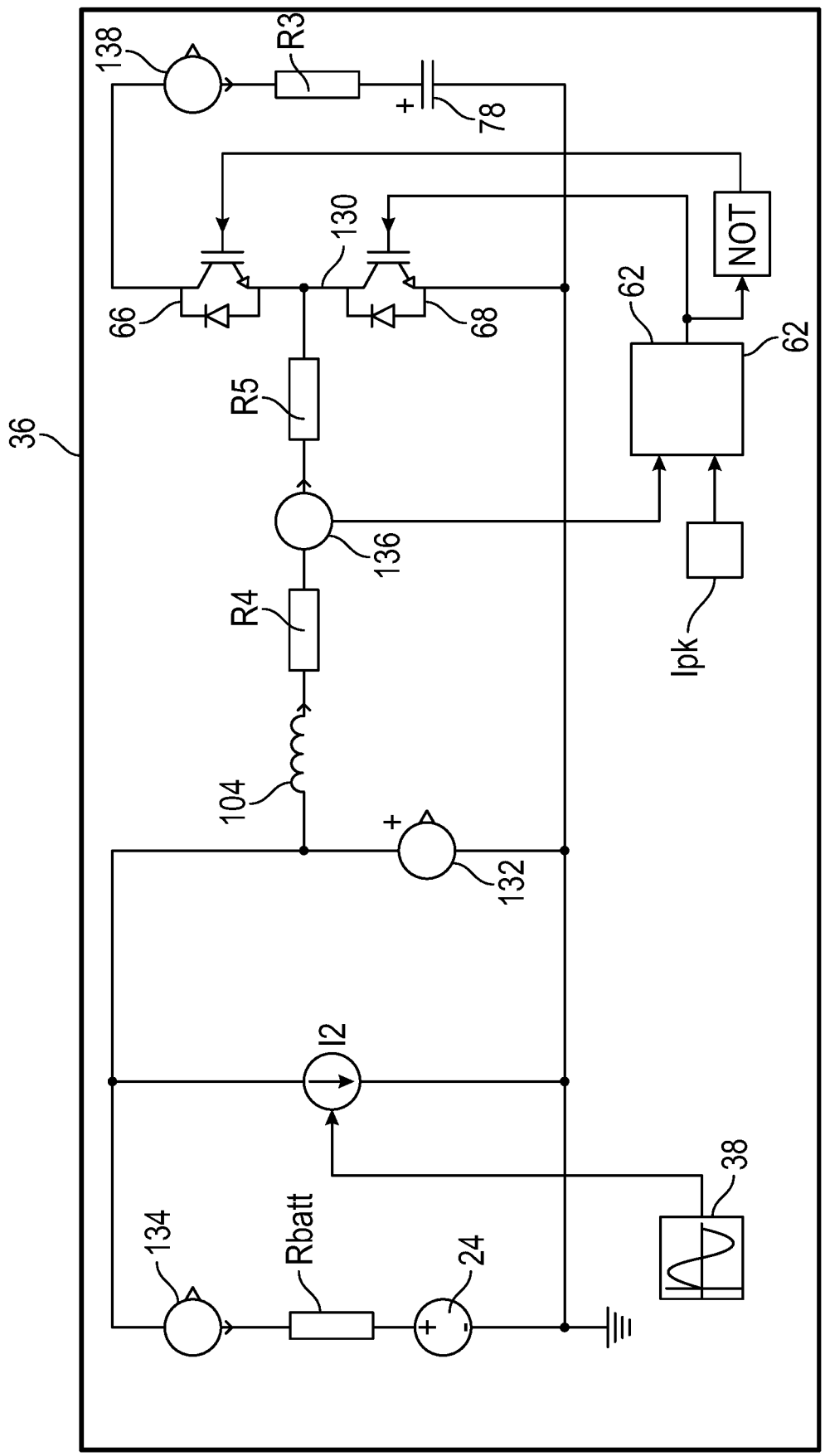
FIG. 5 schematically illustrates operation of the first inverter of FIG. 3 to heat a battery assembly or system using an idle electric motor, in accordance with an exemplary embodiment.

FIG. 5 schematically illustrates operation of the leg of the inverter 36 as a QRC to generate the AC heating current while the inverter 36 is idle (e.g., during vehicle motion). The inverter 36 is controlled by the controller 62 to apply the AC heating current through the battery pack 24 (represented as a resistance $R_{batt}$). The inductor 104 is connected between a node 130 (HB1) of the half bridge (switches 66 and 68) and a positive terminal of the battery pack 24. Resistances between the inductor 104 and the node 130 are represented as resistances R4 and R5.

The inverter 36 is also connected to various sensors for monitoring parameters thereof. For example, a voltmeter 132 is provided to measure the battery voltage $V_{batt}$, and an ammeter 134 is provided to measure the battery discharge current ($I_{batt}$). Other sensors may include an ammeter 136 for measuring current ($I_{L1}$) through the inductor 104 and an ammeter 138 for measuring current across the capacitor 78. The resistance between the ammeter 138 and the capacitor 78 is represented as a resistance R3. One or more of the sensors is configured to send measurements to the controller 62 to facilitate operation of the QRC to provide heating.

The inverter 36 is operated to heat the battery pack 24 by putting the switch 68 into an ON state or closed state, and putting the switch 66 into an OFF state or open state for a period of time to allow the battery pack 24 to source current through the inductor 104. Thereafter, the switch 68 is opened (put into an OFF state) and the switch 66 is closed (put into an ON state) to couple the inductor 104 and the capacitor 78 and place the series LC combination across the battery pack 24. The switch 68 is left in the OFF state and the switch 66 is left in the ON state long enough for the QRC to oscillate.

The controller 62 provides a control signal, such as a pulse width modulation (PWM) signal, having a selected or preset period between pulses and pulse width. The control signal is adjusted based on a desired amount of heating by adjusting signal parameters such as pulse width, duty cycle, frequency, signal amplitude and others.

The controller 62 receives a reference current ($I_{Ref}$), and continuously or periodically measures a sensed current value ($I_{sense}$) from the ammeter 136. The reference current may be a peak current indication that specifies a maximum peak current ($I_{pk}$) that can be applied. The controller 62 can control the PWM signal and control switching, and suspend operation of the reference current exceeds the peak current (e.g., via a NOT signal).

In this way, the AC heating current is applied to the battery pack 24. The AC heating current is superimposed on current being drawn by the inverter 38 (represented as current I2).

Figure 6:
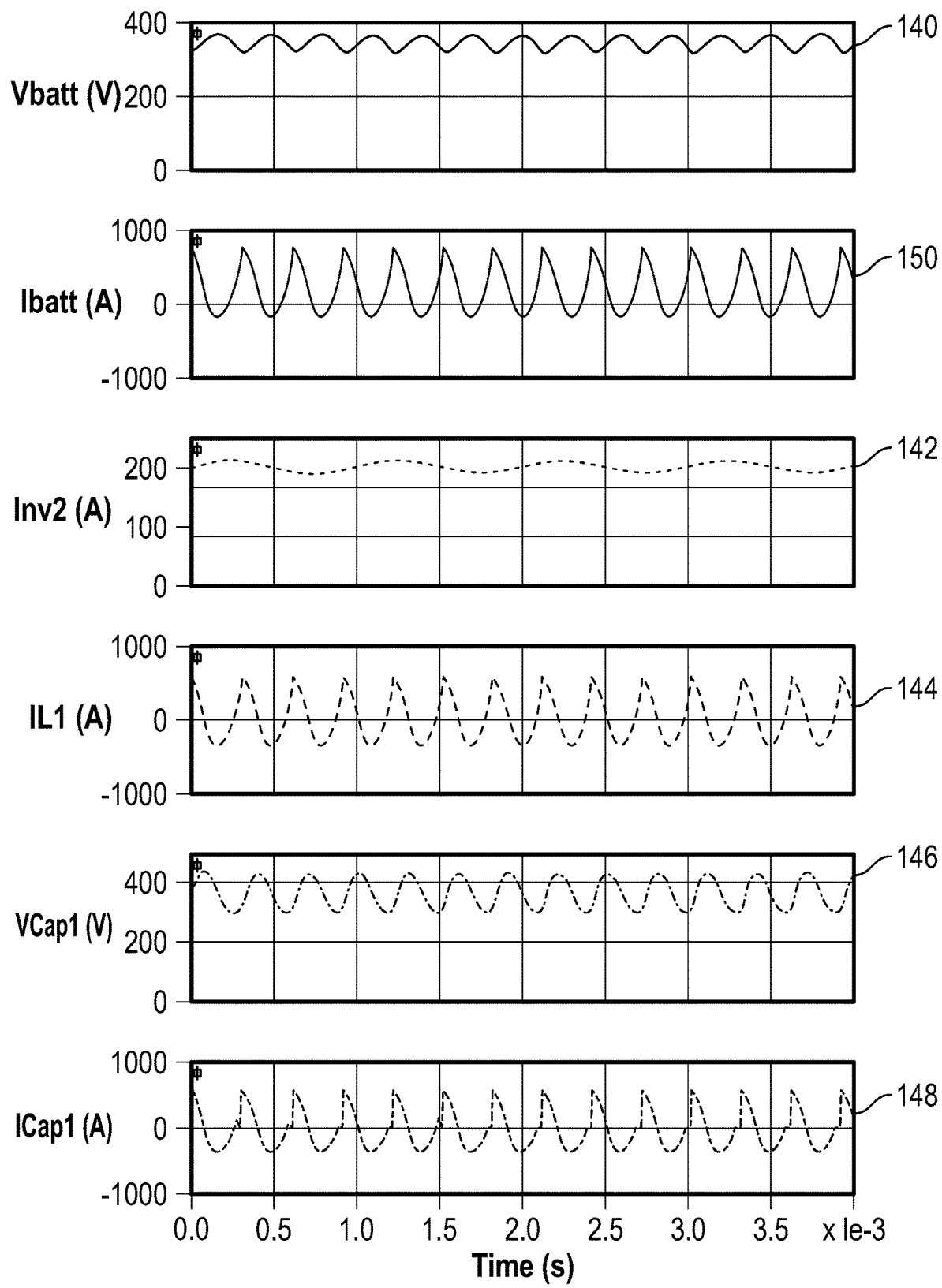
FIG. 6 depicts examples of current through components of the first inverter of FIGS. 3 and 5 during operation to heat the battery system.

FIG. 6 shows an example of an AC heating current applied using the inverter 36 during vehicle motion. Curve 140 shows the battery voltage $V_{batt}$ as a function of time. In this example, the inverter 38 draws an average current $I_{Inv2}$ of 200 A with a 10 A current ripple, as shown by curve 142. Current $I_{L1}$ through the inductor 104 is shown by curve 144, voltage $V_{Cap1}$ across the capacitor C1 is shown by curve 146, and current $I_{cap1}$ through the capacitor C1 is shown by curve 148. The AC heating current and the current $I_{Inv2}$ are reflected in the discharge current $I_{batt}$, as shown by curve 150.

Figure 7:
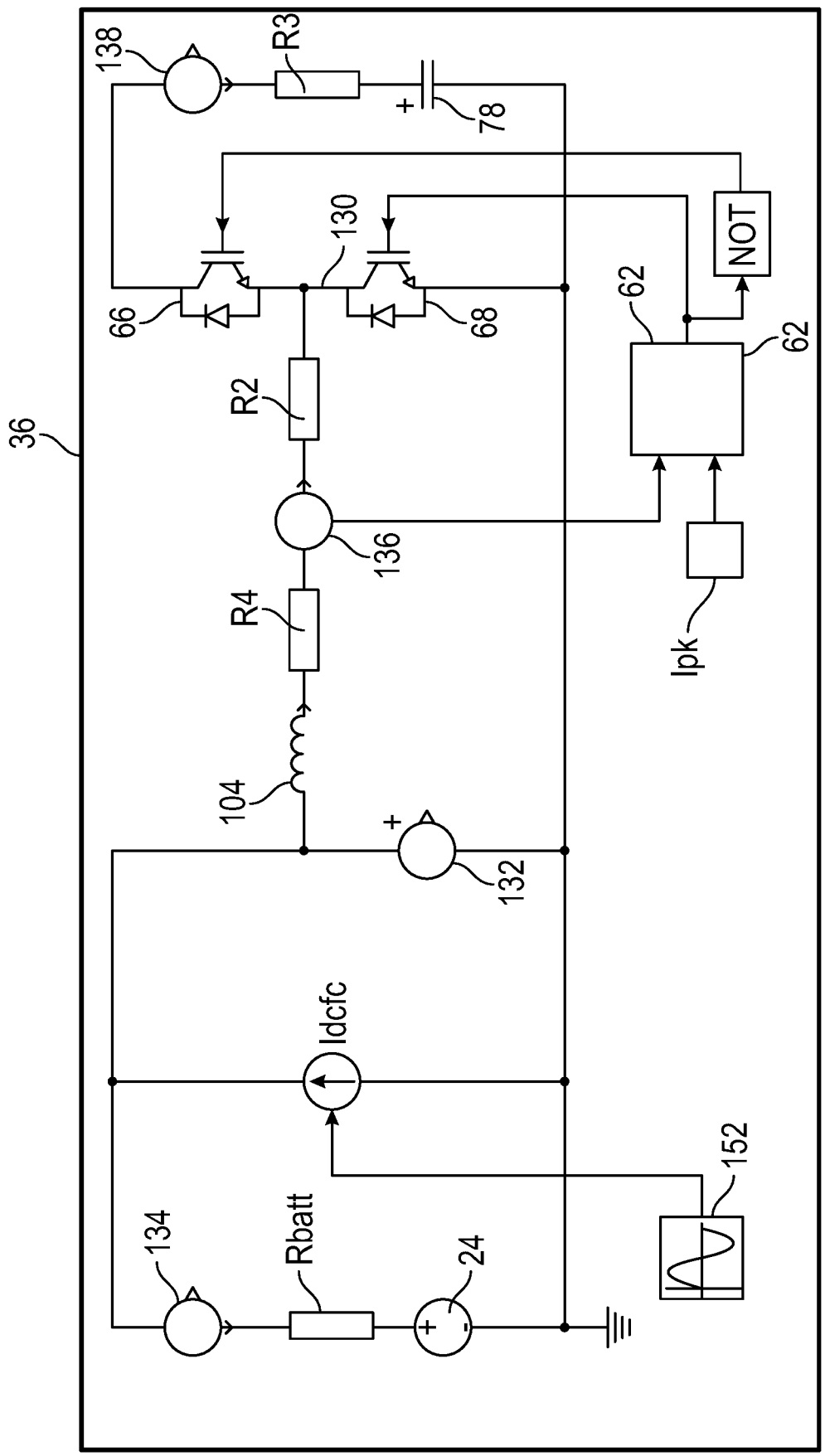
FIG. 7 schematically illustrates operation of the first inverter of FIG. 4 to heat a battery assembly or system during charging, in accordance with an exemplary embodiment.

FIG. 7 schematically illustrates operation of the leg of the inverter 36 as a QRC to generate the AC heating current during charging (e.g., DCFC). In this example, the AC heating current is superimposed on current $I_{dcfc}$ supplied by a DCFC charging station 152. The inverter 36 is controlled by the controller 62 to apply the AC current through the battery pack 24 by controlling the switches 66 and 68 as discussed in conjunction with FIG. 5. The battery current $I_{batt}$, in this example, is a net battery current including the AC heating current superimposed on current $I_{dcfc}$.

Figure 8:
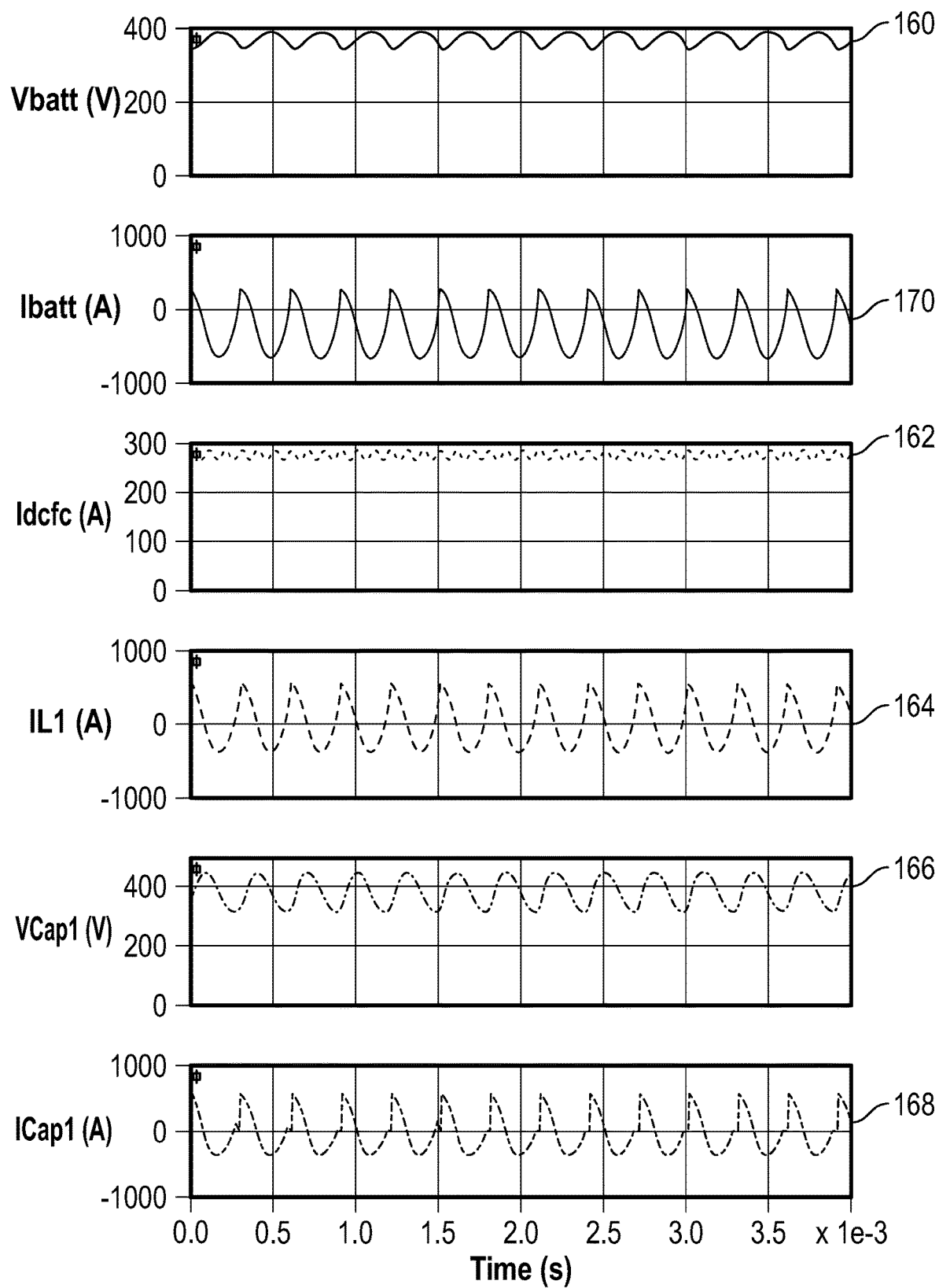
FIG. 8 depicts examples of current through components of the first inverter of FIGS. 4 and 7 during operation to heat the battery system.

FIG. 8 shows an example of an AC heating current generated using the inverter 36 during DCFC. Curve 160 shows the battery voltage $V_{batt}$ as a function of time. In this example, the charging station 152 provides an average current $I_{dcfc}$ around 280 A with a 10 A current ripple, as shown by curve 162. Current $I_L$ through the inductor 104 is shown by curve 164, voltage $V_{cap1}$ across the capacitor C1 is shown by curve 166, and current $I_{cap1}$ through the capacitor C1 is shown by curve 168. The AC heating current and the current $I_{dcfc}$ are reflected in the net battery current $I_{batt}$ (curve 170).

In an embodiment, the heating system 60 is configured to heat the battery pack 24 using a DC-DC converter in the vehicle 10. The DC-DC converter can be operated to generate a heating current using energy from an idle motor, and/or using energy from a charging station or other energy source during a charging (e.g., DCFC) process. In the following, the DC-DC converter used is the DC-DC converter 32, but is not so limited.

Figure 9:
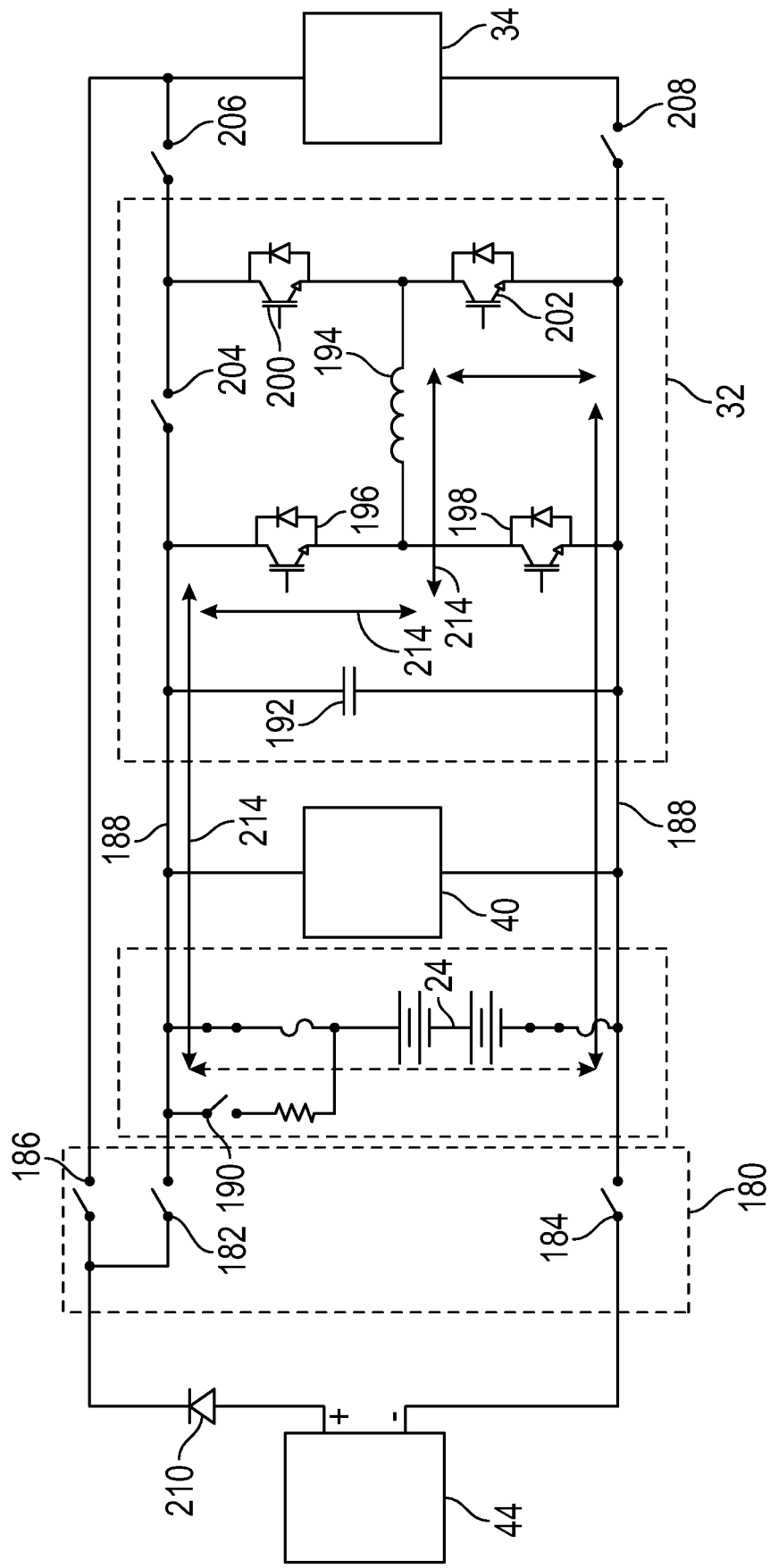
FIG. 9 depicts a DC-DC converter configured for use as part of a battery heating system to apply a heating current to a battery assembly or system during vehicle operation and or during charging of the battery system, in accordance with an exemplary embodiment.

FIG. 9 depicts an embodiment of the heating system 60 including the DC-DC converter 32. In this embodiment, the DC-DC converter 32 is connected to the charge port 44 via a switching assembly 180. The switching assembly 180 includes a switch 182 (S1), a switch 184 (S2) and a switch 186 (S3). The DC-DC converter 32 can be selectively connected to the charge port 44 by closing switches 182 (S1) and 184 (S2).

The DC-DC converter 32 includes a DC-DC converter bus 188 that connects the DC-DC converter 32 to the battery pack 24. A pre-charge switch 190 (SPC) is connected to a resistance and allows for selective engagement of the battery pack 24 with the charge port 44. The system 60 also includes a switch 206 (S7) and a switch 208 (S8) for selectively connecting the DC-DC converter 32 to the inverter module 34.

The DC-DC converter 32 includes a capacitor 192 (C1) connected in parallel to a full bridge switching configuration. In the full bridge configuration, an inductor 194 is connected to a half bridge including a switch 196 (T1) and a switch 198 (T3), and to a half bridge including a switch 200 and a switch 202 (C2). A switch 204 (S0) provides a bypass to the connection between the DC-DC converter 32 and the inverter module 34. If the switch 204 (S0) is closed, DC-DC converter action to the inverter module 34 is bypassed.

Various switches are controllable to put the DC-DC converter 32 into a heating mode. During vehicle motion, if heating is not desired, switches 182 (S1), 184 (S2) and 186 (S3) are open, and switches 206 (S7) and 208 (S8) are closed. To put the DC-DC converter 32 into the heating mode, switches 204 (S0), 206 (S7) and 208 (S8) are opened. The switches 182 (S1), 184 (S2) and 186 (S3) are closed to allow the battery pack 24 to supply power to the inverter module 34 while the DC-DC converter 32 is used for generating the AC heating current.

To generate the AC heating current, switch pairs 196, 202 are controlled during a first half of an AC cycle to store energy across the inductor 194 and the capacitor 192, and then switches 198 and 200 are controlled during a second half of the AC cycle to discharge the stored energy back into the battery pack 24. The flow path of the AC heating current is shown by arrows 214.

As noted above, the system 60 can be configured for use in heating during vehicle operation and/or during charging. For heating during charging, a diode 210 may be included to prevent flow of the AC heating current to the charging station or other energy source.

Figure 10:
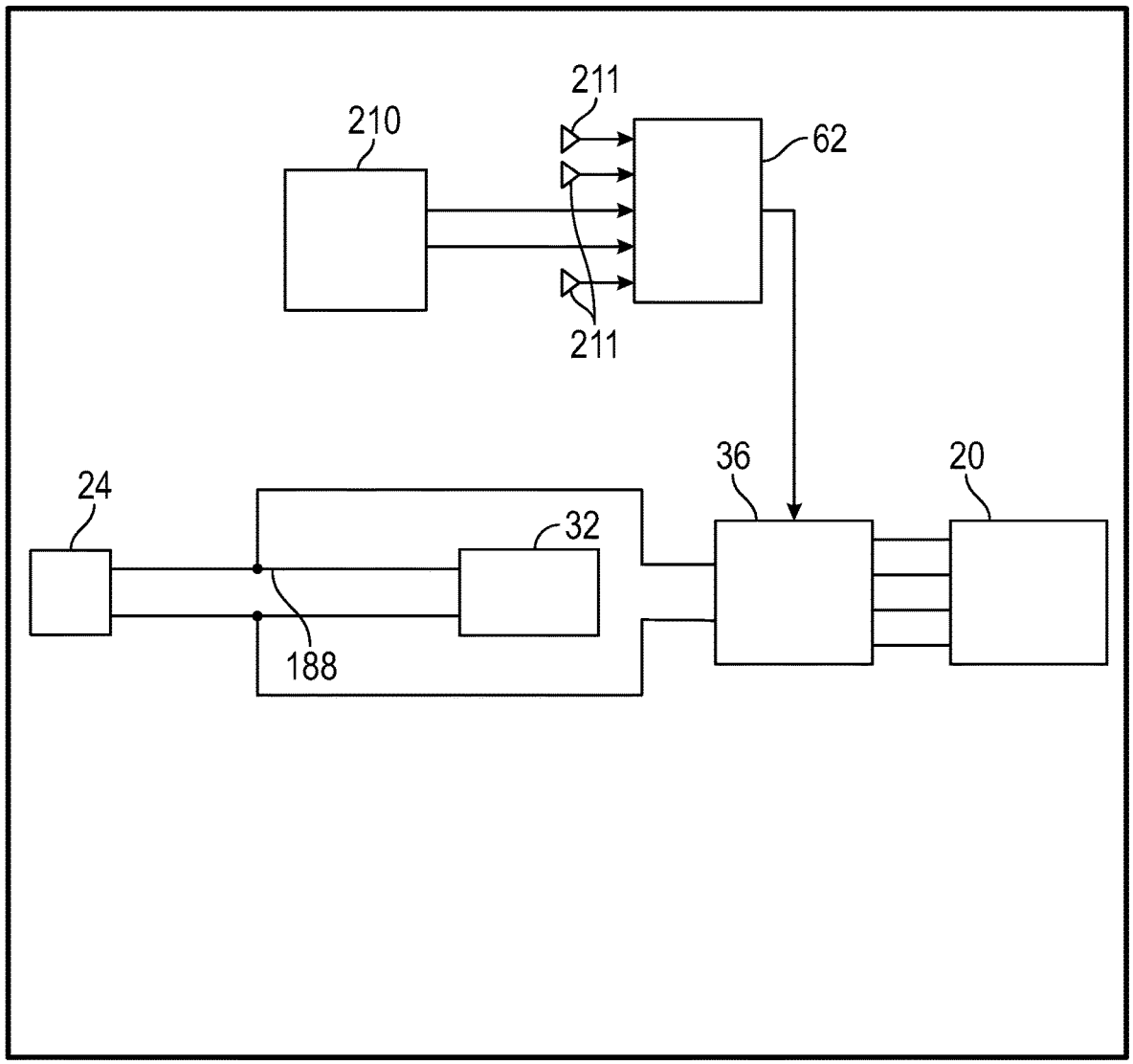
FIG. 10 schematically illustrates operation of the DC-DC converter of FIG. 9 to heat a battery assembly or system during vehicle operation using an idle electric motor, in accordance with an exemplary embodiment.

FIG. 10 illustrates operation of the heating system 60 to apply the AC heating current. The controller 62 receives input data including motor speed, torque and motor currents Id, Iq for each motor 20 and 21 from respective motor drivers, such as a motor driver 213 connected to the motor 20. In this example, the motor 20 is idle and therefore not producing torque. The controller 62 also receives input data 211 including voltage $V_{bus}$ on the DC-DC bus 188, phase currents $i_{abc}$ and phase angles θ through an inverter in the TPIM (e.g., the inverter 36). Based on the input data, the controller 62 applies an AC heating current using PWM modulation to the phase legs of machine 20, so as to generate the AC heating current in the DC-DC converter bus 188 and the battery pack 24.

Figure 11:
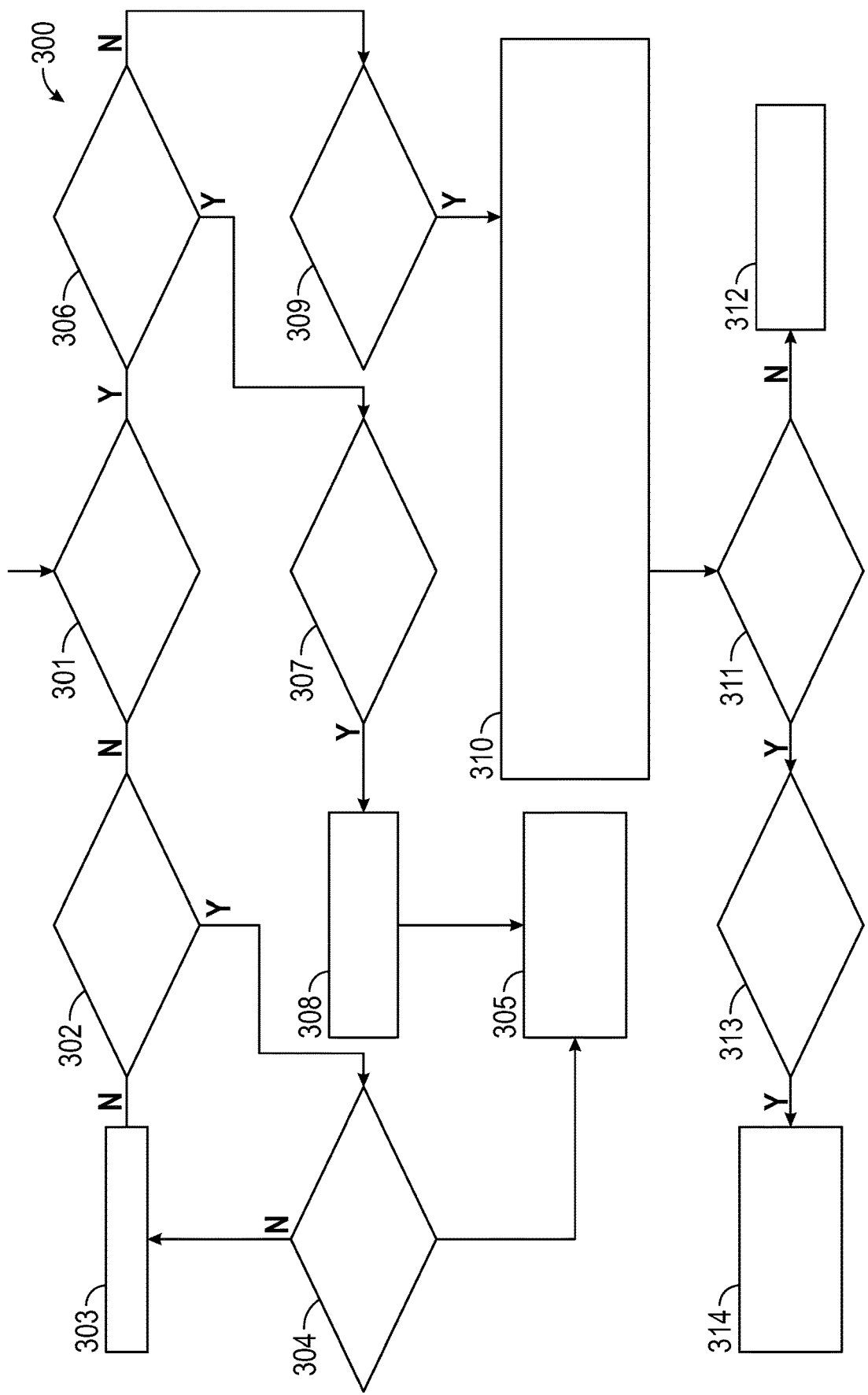
FIG. 11 is a flow diagram depicting aspects of a method of heating a battery assembly or system, in accordance with an exemplary embodiment.

FIG. 11 illustrates embodiments of a method 300 of heating a battery assembly and/or other vehicle component or system by controlling a conversion device in a vehicle. Aspects of the method 300 may be performed by the controller 62 or other suitable processing device. In addition, the method 300 is described in conjunction with the vehicle 10 and components thereof, but is not so limited, as the method 300 may be performed in conjunction with any suitable vehicle or battery assembly, and with any suitable type of conversion device.

The method 300 includes a number of steps or stages represented by blocks 301-312. The method 300 is not limited to the number or order of steps therein, as some steps represented by blocks 301-312 may be performed in a different order than that described below, or fewer than all of the steps may be performed.

At block 301, the processing device determines whether the vehicle 10 propulsion system is active (e.g., the vehicle is in motion and torque is applied).

At block 302, if the propulsion system is not active, the processing device determines whether the vehicle 10 is in a charging mode (e.g., is connected to a charging station and is receiving charging current). For example, the processing device determines whether the vehicle 10 is in a DCFC mode. If not, the method 300 ends at block 303.

If the vehicle 10 is in a charging or DCFC mode, at block 304, an internal temperature of the battery pack 24 is measured or estimated. For example, the processing device receives a temperature measurement from the RESS system. If the temperature is greater than or equal to a selected threshold, the method 300 ends at block 303.

At block 305, if the temperature is above the threshold, the heating system 60 is controlled to apply an AC heating current. The AC heating current can be applied using an inverter or DC-DC converter as discussed herein. Parameters of the current are controlled to effect a desired temperature rise or rate of change and may be maintained until the temperature reaches a desired value or charging stops.

At block 306, if the propulsion system is active, the processing device determines whether the battery pack temperature is at or below a threshold and/or whether heating is desired. For example, the processing device can receive a priority level from the RESS system.

At block 307, if battery heating is desired (e.g., RESS priority level is high), the processing device determines if all wheel drive (AWD) can be disabled. If so, AWD is disabled at block 308, and AC heating is performed (block 305).

At block 309, if battery heating is not desired, the processing device determines whether cabin heating is requested. If so, at block 310, a desired heating power is estimated. The heating power is estimated based on the cabin heating power, added heat from the vehicles heat pump compressor, and power electronics (PE) waste heat. The desired heating power may be based on the following equation:

$$\text{Desired AC heating Power} = \frac{1}{\eta_{chiller}}(\text{Cabin\_Heating\_Power} - \text{Compressor Heat Add}) - PE \text{ Waste Heat}$$

At block 311, it is determined whether the desired heating power is greater than zero. If not, the method ends (block 312).

If the desired power is greater than zero, it is determined at block 313 if AWD can be disabled. If so, AWD is disabled and AC heating is applied to heat the battery pack 24 at a desired rate of change (block 314).

Figure 12:
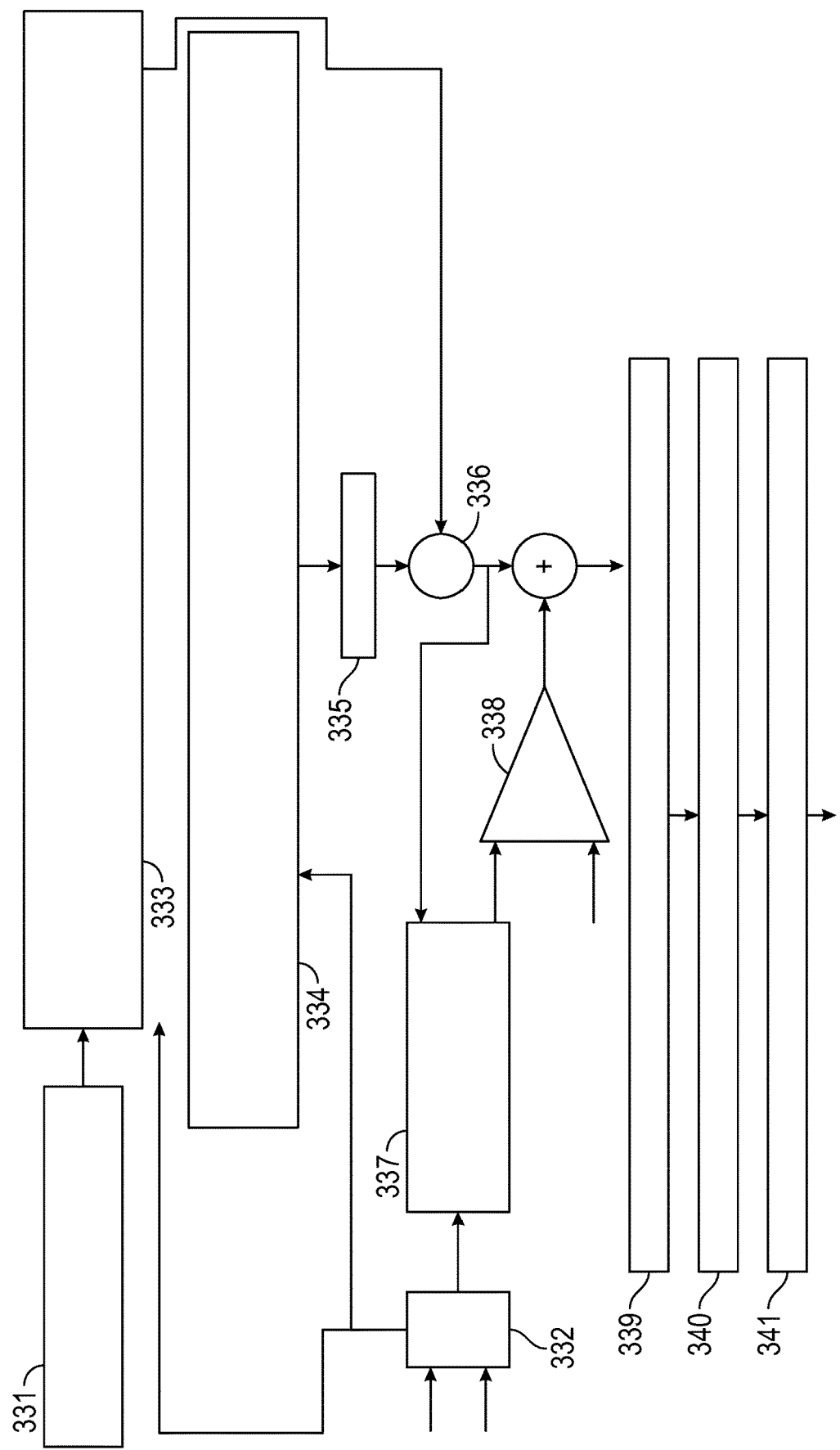
FIG. 12 is a flow diagram depicting aspects of a method of heating a battery assembly or system, in accordance with an exemplary embodiment.

FIG. 12 illustrates embodiments of a method 330 of heating and/or controlling the temperature of a battery assembly. Aspects of the method 330 may be performed by the controller 62 or other suitable processing device. The method 330 can be used to generate and control an AC heating current to provide a uniform or constant temperature rise.

The method 330 includes a number of steps or stages represented by blocks 331-341. The method 330 is not limited to the number or order of steps therein, as some steps represented by blocks 331-341 may be performed in a different order than that described below, or fewer than all of the steps may be performed.

At block 331, the desired rate of temperature rise for a battery cell is input to a processing device, such as the controller 62. The desired rate is denoted $$\frac{dT^*\text{cell, ini}}{dt}.$$

At block 332, the temperature $T_{cell}$ and state of charge (SOC) of each cell in a battery module (e.g., a module 26) are input to a lookup table (LUT). The LUT outputs an impedance value $R_{cell}$.

At block 333, the desired rate of temperature rise and the impedance $R_{cell}$ are used to estimate a root mean square (RMS) of the desired current through each cell. This value is denoted as I*cell,RMS, and may be calculated based on the following equation:

$$I^2_{cell,RMS} = \frac{1}{R_{cell}} * \left( \left( \frac{1}{\#\text{cells in module}} * m_{mod} * C_{p,mod} * \frac{dT^*\text{cell, ini}}{dt} \right) - hA(T_{cell} - T_{cool}) \right)$$

In this equation, $m_{mod}$ is the mass of the battery module, $C_{p,mod}$ is the specific heat capacity of a module, and hA is the product of a heat transfer coefficient and an effective area of a cooling surface. $T_{cool}$ is a coolant temperature. The square root of $I_{cell,RMS}$ is iteratively calculated and provided as a desired battery AC current I*$_{cell,RMS}$.

At block 334, the maximum allowable peak current $I_{cell,AC,peak,allowed}$ is calculated, based on $R_{cell}$ as received from the LUT. In an embodiment, this value is calculated based on the following equation:

$$I_{cell,AC,peak,allowed} = \frac{a}{R_{cell}} * \min[(V_{cellmin,meas} - V_{cellmin,lim}), (V_{cellmax,lim} - V_{cellmax,meas})];$$

$$\alpha < 1,$$

where $V_{cellmin,meas}$ is the lowest cell voltage measured in the module, and $V_{cellmax,means}$ is the highest cell voltage measured in the module. $V_{cellmin,lim}$ is the minimum cell voltage, and $V_{cellmax,lim}$ is the maximum cell voltage. α is a current limiting factor.

At block 335, $I_{cellAC,peak,allowed}$ is converted to RMS to generate a value denoted $I_{cell,AC,RMS,allowed}$.

At block 336, I*cell,RMS and $I_{cellAC,RMS,allowed}$ are compared. The lowest of these values is determined. This value is denoted as a desired current RMS, which is fed forward (as a value denoted I*$_{cell,ff,RMS}$) and used to update the desired temperature rate rise at block 337 (e.g., if this value exceeds the maximum allowable current through a cell).

At block 338, the desired temperature rise (or updated desired temperature rise) is provided to a feedback control, along with a measured temperature rise. The feedback control limits the desired current RMS if the measured rate of rise exceeds the desired rate of rise.

At block 339, the resulting desired current RMS (I*$_{cell,RMS}$) is limited or constrained based on other temperature limits, such as temperature limits of power electronics. The desired pack current is estimated at block 340 based on the configuration of the battery pack (e.g., number of modules), and is constrained based on the power capability of the heating system 60 (block 341). The AC heating current is applied to the battery pack 24, where $I^*_{batt}(t)$ is the peak current applied to the battery pack based on $I^*_{cell,RMS}$. The AC heating current has a frequency that is a function of cell temperature and SOC.

Figure 13:
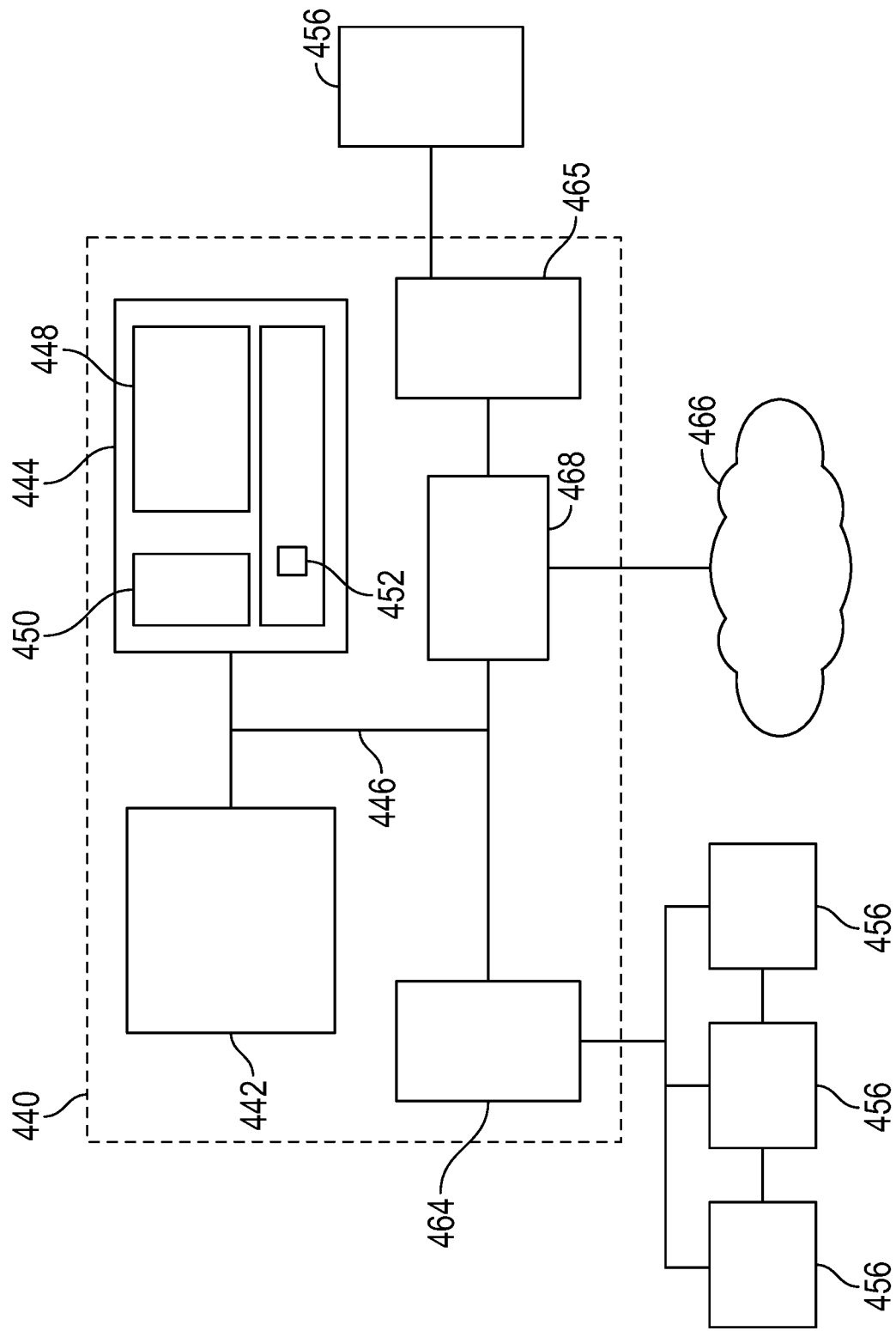
FIG. 13 depicts a computer system in accordance with an exemplary embodiment.

FIG. 13 illustrates aspects of an embodiment of a computer system 440 that can perform various aspects of embodiments described herein. The computer system 440 includes at least one processing device 442, which generally includes one or more processors for performing aspects of image acquisition and analysis methods described herein.

Components of the computer system 440 include the processing device 442 (such as one or more processors or processing units), a memory 444, and a bus 446 that couples various system components including the system memory 444 to the processing device 442. The system memory 444 can be a non-transitory computer-readable medium, and may include a variety of computer system readable media. Such media can be any available media that is accessible by the processing device 442, and includes both volatile and non-volatile media, and removable and non-removable media.

For example, the system memory 444 includes a non-volatile memory 448 such as a hard drive, and may also include a volatile memory 450, such as random access memory (RAM) and/or cache memory. The computer system 440 can further include other removable/non-removable, volatile/non-volatile computer system storage media.

The system memory 444 can include at least one program product having a set (e.g., at least one) of program modules that are configured to carry out functions of the embodiments described herein. For example, the system memory 444 stores various program modules that generally carry out the functions and/or methodologies of embodiments described herein. A module or modules 452 may be included to perform functions related to controlling heating operations as discussed herein. The system 440 is not so limited, as other modules may be included. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The processing device 442 can also communicate with one or more external devices 456 as a keyboard, a pointing device, and/or any devices (e.g., network card, modem, etc.) that enable the processing device 442 to communicate with one or more other computing devices. Communication with various devices can occur via Input/Output (I/O) interfaces 464 and 465.

The processing device 442 may also communicate with one or more networks 466 such as a local area network (LAN), a general wide area network (WAN), a bus network and/or a public network (e.g., the Internet) via a network adapter 468. It should be understood that although not shown, other hardware and/or software components may be used in conjunction with the computer system 440. Examples include, but are not limited to: microcode, device drivers, redundant processing units, external disk drive arrays, RAID systems, and data archival storage systems, etc.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A device for thermal control of a battery system, comprising:
a heating control module electrically connected to the battery system and a conversion device configured to control power output from the battery system, the conversion device including a first inverter connected to a first electric motor, wherein the first inverter includes a plurality of phase legs, the plurality of phase legs are selectively connected to a propulsion bus by a set of switches, and a selected phase leg of the plurality of phase legs is selectively connected to a terminal of the battery system by a switch, the heating control module configured to perform:
measuring a current through the first inverter, the measured current provided by rotation of the first electric motor when the first electric motor is not producing torque, or provided by an energy source during vehicle charging;
opening the set of switches to disconnect the plurality of phase legs from the propulsion bus, and closing the switch to electrically connect the selected phase leg to the terminal;
controlling the first inverter to modulate the current through the conversion device and produce an alternating current (AC) heating current wherein controlling the first inverter includes controlling the selected phase leg of the first inverter to produce the AC heating current; and
applying the AC heating current to the battery system to heat the battery system to a desired temperature.

2. The device of claim 1, wherein the vehicle includes a second electric motor connected to a second inverter.

3. The device of claim 1, wherein the selected phase leg is controlled to maintain a magnitude of the AC heating current below a maximum peak current, the maximum peak current calculated based on a maximum cell voltage of the battery system and a desired rate of temperature rise.

4. The device of claim 1, wherein the selected phase leg includes a quasi-resonant circuit (QRC) having an inductor, a capacitor and a half bridge switch configuration, and controlling the selected phase leg includes controlling the QRC to produce the AC heating current.

5. The device of claim 2, wherein the first electric motor and the battery system provide the measured current during vehicle operation and when the first electric motor is idle.

6. The device of claim 2, wherein the measured current is provided by the energy source during the charging.

7. The device of claim 1, wherein controlling the conversion device includes electrically connecting the energy source to the selected phase leg of the first inverter.

8. The device of claim 3, wherein the measured current is modulated based on a desired root mean square (RMS) of the AC heating current, the RMS estimated based on the desired rate of temperature rise.

9. The device of claim 3, wherein the RMS is estimated based on the desired rate of temperature rise and an impedance value, the impedance value determined based on a temperature and a state of charge of the battery system.

10. A method of thermally controlling a battery system of a vehicle, comprising:

measuring a current through a first inverter connected to a first electric motor, the first inverter configured to control power output from the battery system, wherein the first inverter includes a plurality of phase legs, the plurality of phase legs are selectively connected to a propulsion bus by a set of switches, and a selected phase leg of the plurality of phase legs is selectively connected to a terminal of the battery system by a switch, the measured current provided by rotation of the first electric motor rotating when the first electric motor is not producing torque, or provided by an energy source during vehicle charging;

controlling, by a heating control module, the first inverter to modulate the current through the conversion device and produce an alternating current (AC) heating current, wherein controlling the first inverter includes opening the set of switches to disconnect the plurality of phase legs from the propulsion bus, closing the switch to electrically connect the selected phase leg to the terminal, and controlling the selected phase leg of the first inverter to produce the AC heating current; and applying the AC heating current to the battery system to heat the battery system to a desired temperature.

11. The method of claim 10, wherein the vehicle includes a second electric motor connected to a second inverter.

12. The method of claim 11, wherein the selected phase leg includes a quasi-resonant circuit (QRC) having an inductor, a capacitor and a half bridge switch configuration, and controlling the selected phase leg includes controlling the QRC to produce the AC heating current.

13. The method of claim 11, wherein the first electric motor and the battery system provide the measured current when the first electric motor is idle.

14. The method of claim 11, wherein the measured current is provided by the energy source during the charging.

15. The method of claim 10, wherein the selected phase leg is controlled to maintain a magnitude of the AC heating current below a maximum peak current, the maximum peak current calculated based on a maximum cell voltage of the battery system and a desired rate of temperature rise.

16. The method of claim 15, wherein the measured current is modulated based on a desired root mean square (RMS) of the AC heating current, the RMS estimated based on the desired rate of temperature rise.

17. A vehicle system comprising:
a memory non-transitory computer readable medium having computer readable instructions; and
a processing device for executing the computer readable instructions, the computer readable instructions controlling the processing device to perform a method including:
measuring a current through a first inverter connected to a first electric motor, the first inverter configured to control power output from a battery system, wherein the first inverter includes a plurality of phase legs, the plurality of phase legs are selectively connected to a propulsion bus by a set of switches, and a selected phase leg of the plurality of phase legs is selectively connected to a terminal of the battery system by a switch, the measured current provided by rotation of the first electric motor rotating when the first electric motor is not producing torque, or provided by an energy source during vehicle charging;
controlling the first inverter to modulate the current through the conversion device and produce an alternating current (AC) heating current, wherein controlling the first inverter includes opening the set of switches to disconnect the plurality of phase legs from the propulsion bus, closing the switch to electrically connect the selected phase leg to the terminal, and controlling the selected phase leg of the first inverter to produce the AC heating current; and
applying the AC heating current to the battery system to heat the battery system to a desired temperature.

18. The vehicle system of claim 17, wherein the vehicle includes a second electric motor connected to a second inverter.

19. The vehicle system of claim 17, wherein the selected phase leg is controlled to maintain a magnitude of the AC heating current below a maximum peak current, the maximum peak current calculated based on a maximum cell voltage of the battery system and a desired rate of temperature rise.

20. The vehicle system of claim 19, wherein the measured current is modulated based on a desired root mean square (RMS) of the AC heating current, the RMS estimated based on the desired rate of temperature rise.

* * * * *